United States Patent [19]

Jastrzebski et al.

[11] Patent Number: 4,615,762
[45] Date of Patent: Oct. 7, 1986

[54] METHOD FOR THINNING SILICON

[75] Inventors: Lubomir L. Jastrzebski, Plainsboro; John F. Corboy, Jr., East Amwell Township, Hunterdon County; Robert H. Pagliaro, Jr., Mercer County; Ramazan Soydan, Berkley Township, Ocean County, all of N.J.

[73] Assignee: RCA Corporation, Princeton, N.J.

[21] Appl. No.: 729,165

[22] Filed: Apr. 30, 1985

[51] Int. Cl.[4] .................. H01L 21/306; B44C 1/22; C03C 15/00; C03C 25/06
[52] U.S. Cl. .................................. 156/628; 148/175; 156/653; 156/657; 156/662; 252/79.3; 427/86; 427/93
[58] Field of Search ............... 156/628, 653, 657, 662; 252/79.3; 148/175; 427/86, 93, 399

[56] References Cited

U.S. PATENT DOCUMENTS

| | | | |
|---|---|---|---|
| 3,767,494 | 10/1973 | Muraoka et al. | 156/17 |
| 3,892,891 | 7/1975 | Goodman et al. | 156/657 X |
| 3,929,529 | 12/1975 | Poponiak | 156/662 X |
| 3,966,517 | 6/1976 | Claes et al. | 156/662 X |
| 4,050,979 | 9/1977 | Smeltzer et al. | 156/647 |
| 4,261,791 | 4/1981 | Shwartzman | 156/662 X |
| 4,454,002 | 6/1984 | Hankins | 156/662 X |

OTHER PUBLICATIONS

Thin Silicon Film on Insulating Substrate, G. L. Kuhn et al., *Journal of Electrochemical Society*, vol. 120, No. 11, Nov. 1973, pp. 1563–1566.

Thomson-CSF, CNET Team for SOI, R. T. Gallagher, *Electronics Week*, Mar. 11, 1985, pp. 26–27.

Preparation of Large-Area Monocrystalline Silicon Thin Windows, N. W. Cheung, *Rev. Sci. Instrum.*, vol. 51, No. 9, Sep. 1980, pp. 1212–1216.

Electrochemically Thinned N/N+ Epitaxial Silicon—Method and Applications, R. L. Meek, *J. Electrochem. Soc.: Electrochemical Technology*, Jul. 1971, pp. 1240–1246.

Preparation of Thin Silicon Crystals by Electrochemical Thinning of Epitaxially Grown Structures, H. J. A. van Dijk et al., *J. Electrochem. Soc.: Solid State Science*, vol. 117, No. 4, Apr. 1970, pp. 553–554.

Isolation Technology for Scaled MOS VLSI, W. G. Oldham, *IEDM Technical Digest*, 1982, pp. 216–219.

Low-Threshold Low-Power CMOS/SOS for High--Frequency Counter Applications, A. C. Ipri et al., *IEEE Journal of Solid-State Circuits*, vol. SC-11, No. 2, Apr. 1976, pp. 329–336.

Kinetics of High Pressure Oxidation of Silicon in Pyrogenic Steam, R. R. Razouk et al., *Journal of Electrochemical Society, Solid State Science and Technology*, vol. 128, No. 10, Oct. 1981, pp. 2214–2220.

*Primary Examiner*—William A. Powell
*Attorney, Agent, or Firm*—Birgit E. Morris; Donald S. Cohen; Kenneth R. Glick

[57] ABSTRACT

A method for substantially uniformly thinning a silicon layer comprises providing a silicon layer having a surface, oxidizing substantially all of the surface so as to transform a uniformly thick layer of silicon into oxide, and removing all the oxide so as to expose the silicon layer.

5 Claims, 6 Drawing Figures

METHOD FOR THINNING SILICON

The present invention relates to a method for uniformly thinning a silicon layer. More particularly the invention relates to a method for thinning a monocrystalline silicon layer which is disposed on an insulator layer.

BACKGROUND OF THE INVENTION

Solid state semiconductor devices are conventionally fabricated on bulk monocrystalline silicon substrates and in monocrystalline silicon islands which are disposed on insulating substrates, commonly referred to as silicon-on-insulator (SOI) structures. SOI structures are particularly desirable when electrical isolation between silicon devices is important, such as in complementary symmetry metal oxide semiconductor (CMOS) field effect transistor (FET) applications. Sapphire (monocrystalline $Al_2O_3$) is a commonly used substrate material for SOI structures and devices fabricated thereon are referred to as silicon-on-sapphire (SOS) devices.

In conventional SOS structures a plurality of monocrystalline silicon islands are disposed on a major surface of the sapphire substrate. It is desirable that the silicon islands be relatively thin, i.e. on the order of approximately 0.5 microns, so that when certain PN junctions are formed therein, by diffusion of dopants from the surface of the silicon, these junctions will extend for approximately the entire thickness of the silicon. This reduces the junction capacitance associated with the depletion region around the PN junction during device operation. However, there are several significant problems when using relatively thin epitaxial silicon on a sapphire substrate. A relatively high defect density, on the order of $10^6$ per centimeter occurs at the silicon/sapphire interface due to the nature of the epitaxial growth. Additionally, the silicon disposed within approximately 0.2 to 0.3 microns of the interface is oriented in a different crystallographic direction. Furthermore, silicon which is epitaxially deposited on sapphire substrates is typically characterized as having a relatively low carrier lifetime, e.g. on the order of approximately <10 nanoseconds.

An alternative approach to forming SOI structures can be based on what is now referred to as the epitaxial lateral overgrowth (ELO) technique, disclosed in copending and commonly assigned U.S. patent application Ser. No. 608,544, METHOD FOR GROWING MONOCRYSTALLINE SILICON THROUGH A MASK LAYER, J. F. Corboy, Jr. et. al., filed May 10, 1984, now U.S. Pat. No. 4,578,142, issued Mar. 25, 1986. Basically, the ELO technique provides a means for forming high quality monocrystalline silicon over a mask layer of, for example, silicon dioxide. The monocrystalline silicon which is epitaxially deposited in the ELO process is of considerably better crystalline quality than the epitaxial silicon deposited on sapphire substrates. However, in the ELO process, depending upon the configuration of the insulator layer on which the monocrystalline silicon layer is formed, it may be necessary to form a layer which is thicker than 0.5 microns. Thus, in such a configuration, it becomes necessary to thin the monocrystalline silicon layer.

A variety of silicon thinning processes are conventionally used in the silicon processing art. However, none of the conventional thinning techniques has been found to be suitable in the present application. Plasma etching of a predetermined amount of the exposed monocrystalline silicon layer does not uniformly remove the silicon. Wet chemical etching also does not etch uniformly and is difficult to control reproducibly. A variety of other conventional silicon thinning techniques is also possible, although these other techniques typically add significant additional processing constraints and do not produce surfaces which are superior to the surface produced by the present invention. Examples of these other thinning techniques are processes which depend upon differing dopant concentrations so as to yield different etch rates, processes which depend upon particular crystallographic orientations, known as orientation dependent etches (ODEs), and electrochemical etching.

As further background to the subject invention, it should be noted that the process of thermally oxidizing silicon is well known in the semiconductor device fabrication art. It is known that oxidation rate is dependent upon such variables as ambient temperature, ambient pressure, ambient constituency and the time of exposure. For example, see KINETICS OF HIGH PRESSURE OXIDATION OF SILICON IN PYROGENIC STEAM, R. R. Razouk et al., *Journal of Electrochemical Society, Solid State Science and Technology*, Vol. 128, No. 10, October 1981, pp 2214-2220. As another example, the thermal oxidation of monocrystalline silicon is conventionally performed in what is referred to as local oxidation of silicon (LOCOS) processing, as described in ISOLATION TECHNOLOGY FOR SCALED MOS VLSI, W. G. Oldham, *IEDM Technical Digest*, 1982, pp 216-219. It is also known that the formation of an oxide on a silicon surface via an oxidation process consumes a certain quantity of the silicon at the surface. In conventional LOCOS processing the localized oxidation of silicon provides a field oxide which is part of the finished device and is located between devices for purposes of electrical isolation.

SUMMARY OF THE INVENTION

A method for substantially uniformly thinning a silicon layer comprises providing a silicon layer having a surface, oxidizing substantially all of the surface so as to transform a uniformly thick layer of silicon into oxide, and removing all the oxide so as to expose the silicon layer.

DETAILED DESCRIPTION OF PREFERRED EMBODIMENT

Figure 1:
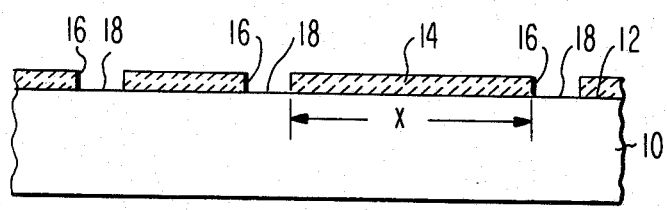
FIGS. 1 through 5 illustrate an exemplary processing sequence in accordance with the preferred embodiment of the method of the present invention.
Figure 2:
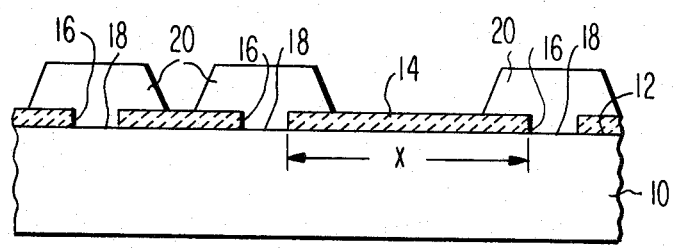
Figure 3:
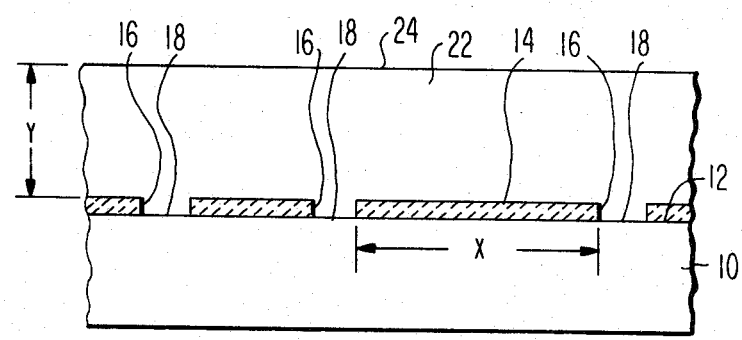

FIGS. 1 through 3 illustrate the basic ELO process as described in the previously described U.S. patent application Ser. No. 608,544. As illustrated in FIG. 1, a substrate 10 having substantially planar surface 12 is initially provided. In the preferred embodiment the substrate material is monocrystalline silicon and the surface 12 represents a major crystallographic plane. However, the substrate material is not so limited, as will subsequently be elaborated upon. An apertured insulation layer 14, which in the preferred embodiment comprises a silicon dioxide ($SiO_2$) layer of approximately 0.1 to 1.0 microns in thickness, is disposed on the substrate surface 12. Silicon dioxide is selected as the insulator material because it is amorphous and it can physically withstand subsequent epitaxial deposition processing. Additionally, an SiO$_2$ layer 14 can readily be formed and apertures can readily be generated therein by conventional photolithographic processing. However, it should be recognized that the present invention is not limited to the use of SiO$_2$ nor is it limited to an insulator layer of a particular thickness. Other suitable insulator materials include, for example, silicon nitride and aluminum oxide.

In FIG. 1 the layer 14 includes a plurality of apertures 16 which might be shaped, for example, as squares, rectangles or stripes. The size, spacing and configuration of the apertures can vary. The dimension identified at X in FIG. 1 represents the widest spacing between adjacent apertures. The portion of the substrate surface 12 exposed by each aperture 16 will hereinafter be referred to as a nucleation site 18. The nucleation sites 18 in FIG. 1 can be located anywhere along the surface 12. The only restriction is that each nucleation site 18 be monocrystalline in structure. This can be achieved, for example, by providing a substrate 10 of bulk monocrystalline material; a monocrystalline layer across the surface 12 of an otherwise non-single crystalline substrate 10; or a polycrystalline surface 12 wherein the grain size is such that each aperture 16 can be defined within the boundaries of a grain.

The structure of FIG. 1 is then subjected to a two stage, silicon deposition/etching cycle. In the first stage, hereinafter the deposition stage, silicon is deposited from a gas mixture which includes a silicon-source gas such as silane (SiH$_4$), dichlorosilane (SiH$_2$Cl$_2$) or silicon tetrachloride (SiCl$_4$) and a carrier gas such as hydrogen. Additionally, a silicon-etching gas such as HCl can be included during the deposition stage. In the second stage, hereinafter the etching stage, a portion of the silicon deposited during the first stage is etched in a gas mixture of a silicon-etching gas such as HCl and a carrier gas such as hydrogen. The deposition/etching cycle is then repeated a predetermined number of times so as to yield the structure of FIG. 2. At each nucleation site 18 crystalline growth proceeds substantially vertically, perpendicular to the surface 12, through the thickness of the layer 14, and then laterally, across the surface of the layer 14. Repetition of the cycle eventually yields a monocrystalline silicon island 20 at each nucleation site 18 as illustrated in FIG. 2.

By continuing the deposition/etching cycle on the structure of FIG. 2, the plurality of silicon islands 20 will eventually grow together so as to form a continuous monocrystalline silicon layer 22 as illustrated in FIG. 3. The thickness of the monocrystalline silicon layer over the insulator layer 14 is identified as Y in FIG. 3. The distance Y represents the thickness at the point in the processing when the silicon islands 20 have coalesced into a layer having a substantially planar surface 24. The distance Y will typically be equal to the spacing X. A typical value for Y is approximately 4.5 to 6 microns.

Figure 4:
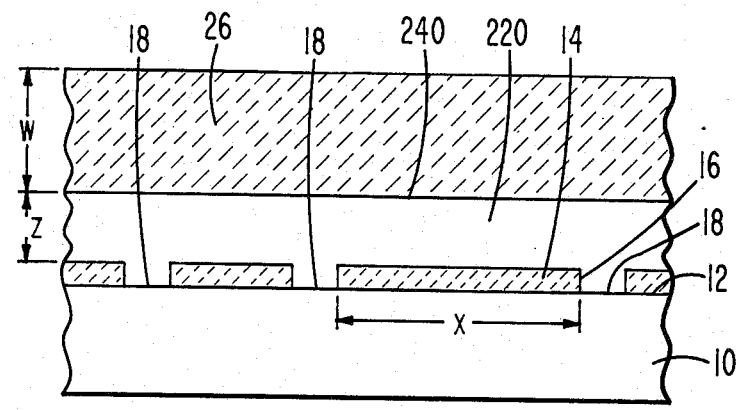

The structure of FIG. 3 is then subjected to a process whereby the monocrystalline silicon layer 22 is oxidized so as to yield the structure of FIG. 4. As is well known in the silicon processing art, the oxidation of a silicon surface consumes a certain quantity of the silicon at that surface. Therefore, as a result of the formation of silicon oxide 26 shown in FIG. 4, the surface 24 of monocrystalline silicon layer 22 of FIG. 3 is now referred to as surface 240 of monocrystalline silicon layer 220. The thickness of the oxide growth is identified as W and the thickness of the resulting silicon layer 22 is identified as Z in FIG. 4. According to well established principles, $Y = Z + 0.45(W)$. Therefore, to achieve a thickness Z from a starting thickness Y one must oxidize to a thickness W. When Y is approximately 6 microns and the desired thickness of Z is approximately 0.5 microns the oxide thickness W required is therefore 12.2 microns.

The desired oxide thickness W may be achieved in a single oxidation step, by exposure to a predetermined temperature for a predetermined time at a predetermined atmospheric pressure, according to well established tables of SiO$_2$ growth rate. By way of example, exposure of a monocrystalline silicon surface 900° C. for 2 hours at 20 atmospheres will grow 2.2 microns of oxide. Exposure at 1000° C. for 400 minutes at atmospheric pressure will grow approximately 1.2 microns of oxide. Alternatively, the oxidation may be performed in several steps, by oxidizing, stripping the oxide, and reoxidizing. This repetitious oxidation process will achieve a silicon layer 220 thickness Z more quickly than a single oxidation step because it repetitiously exposes bare silicon to the oxidizing atmosphere.

Figure 5:
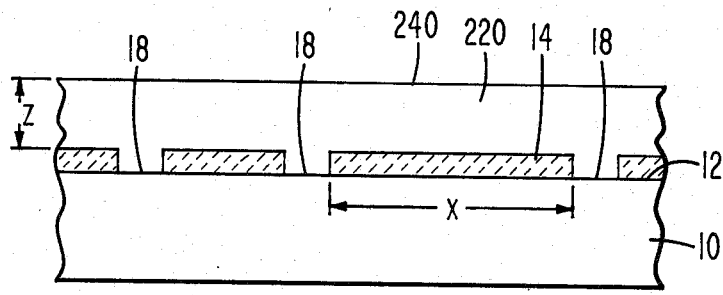

As shown in FIG. 5, the oxide 26 is then stripped from the silicon layer 220, for example, by a selective wet chemical etch such as buffered HF. A selective etchant such as buffered HF will effectively remove all of the silicon oxide 26 without damaging the surface 240 of the silicon layer 220. The surface 240 remains in its original, high crystalline quality condition. After the thinned silicon layer 220 has been formed in accordance with the preceding method, the layer 220 may be selectively subdivided so as to form one or more SOI islands 28 as shown in FIG. 6.

Figure 6:
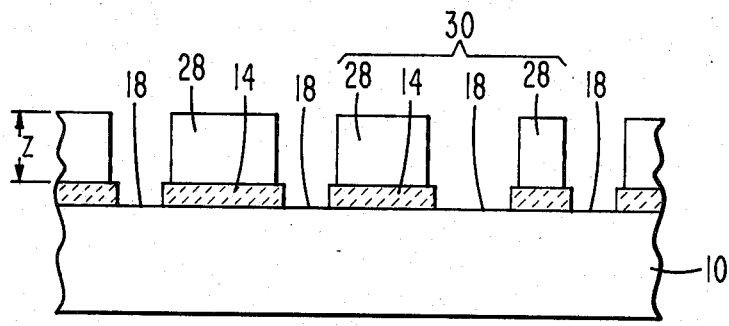
FIG. 6 illustrates a processing step which might typically follow the sequence of FIGS. 1-5.

Using the structure of FIG. 5 as a starting point, the structure of FIG. 6 can be fabricated using conventional photolithographic techniques. To achieve the structure of FIG. 6 the silicon layer 220 is selectively removed in areas which correspond to nucleation sites 18. This will yield a plurality of monocrystalline silicon islands which are isolated from the substrate 10 by the insulator layer 14. It should be noted, however, that the pattern of these SOI islands 28 need not correspond to the original pattern of the insulator layer 14. For example, as shown in the area identified at 30, a portion of the insulator layer 14 as well as the overlying portion of monocrystalline silicon can also be removed.

After the SOI islands 28 have been formed, conventional fabrication techniques may be utilized to form solid state devices within the islands. For example, CMOS devices may be fabricated in the SOI islands 28 using a process similar to that which is described in LOW-THRESHOLD LOW-POWER CMOS/SOS FOR HIGH-FREQUENCY COUNTER APPLICATIONS, A. C. Ipri et al, *IEEE Journal of Solid-State Circuits*, Vol. SC-11, No. 2, April 1976, pp 329–336.

Lastly, it should be noted that the thinning process of the present invention is not limited to usage on ELO fabricated structures. Rather, the described thinning process may also be used in other silicon processing sequences to provide a controlled uniform removal of silicon. Additionally, although the invention is described in terms of substantially uniformly thinning a silicon layer which is planar in structure, the invention may also be used to substantially uniformly thin a non-planar silicon layer.

What is claimed is:

1. A method for substantially uniformly thinning an epitaxially grown silicon layer comprising:

forming an insulator layer having a plurality of apertures therein on a substrate, the widest spacing between apertures being X;

epitaxially depositing silicon within the apertures and over the insulator layer so as to form a continuous monocrystalline silicon layer having a thickness substantially equal to X;

oxidizing substantially all of the surface of the monocrystalline silicon layer so as to transform a uniformly thick layer of said silicon layer into oxide; and removing all of said oxide so as to expose said silicon layer.

2. A method in accordance with claim 1 wherein said silicon layer is substantially planar.

3. A method in accordance with claim 1 wherein said oxidizing is performed by heating at a predetermined temperature at a predetermined pressure for a predetermined time.

4. A method in accordance with claim 1 further comprising repeating said oxidizing and removing steps a predetermined number of times.

5. A method in accordance with claim 1 wherein said removing is performed by immersion in buffered HF.

* * * * *